United States Patent
Basire et al.

[11] Patent Number: 5,666,035
[45] Date of Patent: Sep. 9, 1997

[54] DIRECT CURRENT ACTUATOR CONTROL SYSTEM USING PULSE-WIDTH MODULATION IN FOUR BIPOLAR TRANSISTORS CONNECTED IN H-MANNER

[75] Inventors: Alain Basire, Versailles; Michel Marceau, Montfort L'Amau, both of France

[73] Assignee: Commissariat A L'Energie Atomique, Paris, France

[21] Appl. No.: 363,396

[22] Filed: Dec. 23, 1994

[30] Foreign Application Priority Data

Dec. 23, 1993 [FR] France ................. 93 15564

[51] Int. Cl.$^6$ ........................................ H02P 7/00
[52] U.S. Cl. ........................................ 318/254; 318/439
[58] Field of Search ................... 318/254, 439, 318/138; 388/804, 811, 819, 903, 907.2; 363/55, 56, 57, 58, 22, 26

[56] References Cited

U.S. PATENT DOCUMENTS

| | | | |
|---|---|---|---|
| 3,736,481 | 5/1973 | Alexanderson | 388/811 |
| 4,146,827 | 3/1979 | Krohn | 388/811 |
| 4,523,134 | 6/1985 | Kinoshita et al. | |
| 4,629,951 | 12/1986 | Weber et al. | |
| 4,633,151 | 12/1986 | Crook | 318/254 |
| 4,654,567 | 3/1987 | Bracha | 318/254 |
| 4,901,366 | 2/1990 | Röttger | 388/811 |
| 4,964,158 | 10/1990 | Okochi et al. | |
| 5,349,275 | 9/1994 | Muller | 318/254 |
| 5,367,600 | 11/1994 | Wilkerson | 388/811 |
| 5,426,355 | 6/1995 | Zweighaft | 388/904 X |

FOREIGN PATENT DOCUMENTS

| | | | |
|---|---|---|---|
| 0 291 803 A3 | 11/1988 | European Pat. Off. | H02P 7/00 |
| 0 578 555 A1 | 1/1994 | European Pat. Off. | H03K 17/691 |

OTHER PUBLICATIONS

Circuit Design, "Designing Improved High Speed Gate Drive Circuits," New Electronics, 18 No. 11 May 1985.
Sony et al., Patent Abstract of Japan, "Driving Circuit of Power MOS Field Effect Transistor," vol. 9, No. 280, Nov. 8, 1985.
Varga et al., "Design of a high-performance floating power Mosfet driving circuit," IECON, 413, Nov. 1987.

*Primary Examiner*—Jonathan Wysocki
*Attorney, Agent, or Firm*—Burns, Doane, Swecker & Mathis, LLP

[57] ABSTRACT

The invention relates to a control system for direct current actuators in power electronics, based on pulse width modulation, comprising a H-bridge of four switches, each switch incorporating a bipolar transistor (T1,T2,T3,T4) and a diode (D1,D2,D3,D4) connected in reverse parallel between the emitter and collector thereof, and a control circuit (11) for said transistors. The control circuit (11) supplies four signals (V1,V2,V3,V4) permitting the time shifting of the switching of these four transistors (T1,T2, T3,T4) in such a way that during a switching of one of them no pair of transistors is simultaneously switched on, both with respect to transistors belonging to two lateral branches of the bridge and transistors belonging to two opposite branches of said bridge.

8 Claims, 6 Drawing Sheets

DIRECT CURRENT ACTUATOR CONTROL SYSTEM USING PULSE-WIDTH MODULATION IN FOUR BIPOLAR TRANSISTORS CONNECTED IN H-MANNER

DESCRIPTION

1. Technical Field

The invention relates to a control system for direct current actuators in power electronics.

2. Prior Art

In the field of the control of direct current or d.c. actuators, the procedure which is widely used is that of pulse width modulation or PWM. The latter makes it possible to improve the efficiency of the amplifier to a considerable extent compared with linear amplification methods. However, it is difficult to carry out this procedure due to the behaviour of the power elements in switching. More or less complex electronic circuits are used and a large amount of energy is lost in the dissipators.

The Unitrode manual "Linear and Integrated Circuits Data and Application Handbook" (April 1990) describes a control system for d.c. actuators using four switches connected in the form of a H-bridge, the load being in the centre of the H. These switches are formed by MOS transistors, at whose terminals is connected in reverse parallel manner a diode. The pulse width modulation principle consists, during an oscillation period, successively closing two transistors positioned diagonally in the bridge and then the two other transistors, for a time which varies as a function of the desired procedure.

In the nuclear field the use of chopper amplifiers in the active area means that the power electronics are exposed to nuclear radiation. This constraint regarding the choice of components is not necessarily compatible with the above-defined efficiency requirements.

The invention also relates to a system making it possible to optimize the efficiency of a chopper amplifier by minimizing the number of components required and by making it resistant to a cumulative dose of gamma radiation between $10^6$ and $10^7$ rads.

The invention relates to the control of direct current actuators by the pulse width modulation method, performed by means of a bridge of four transistors supplied in accordance with a diagonal of the bridge, the load, i.e. the actuator, being connected in the second diagonal. The synchronized control of two opposite transistors of the bridge and then that of the two others makes it possible to vary the mean current in the actuator and therefore the torque. The actuator can be torque-controlled through the use of a sensor for measuring said mean current.

The invention is directed at the control of an actuator located in a radioactive environment. To this end it is characterized by the use, for forming the bridge, of bipolar transistors able to adequately withstand irradiation and by a particular sequencing of the control pulses of the transistors using a minimum time between the fronts of said pulses, both for those which control the transistors connected in series at the supply terminals and for those controlling opposite transistors of the bridge. Therefore the power dissipated by the transistors is reduced and the system efficiency improved.

FIG. 8 of U.S. Pat. No. 4,964,158 describes a d.c.—d.c. converter for the supply of a telephone bell. It uses the same bridge and the same control pulse sequencing of the four bipolar transistors, but does not constitute a pulse width modulation control system, the output signal being a pseudoalternative wave, which is fixed once and for all and permits no servo-control.

U.S. Pat. No. 4,523,134 describes a supply system for a d.c. motor, with pulse width modulation. The sequencing of the control pulses is such that it is possible to recover pulses relative to the opposite transistors of the bridge.

EP-A-578,555 describes a supply system for a three-phase synchronous motor using non-bipolar, IGBT-type transistors and the controls take place by brief pulses able to control the IGBT's, but inapplicable to bipolar transistors.

DESCRIPTION OF THE INVENTION

The direct current motor control system according to the invention is based on the pulse width modulation principle using a bridge of four bipolar transistors connected in H-manner and making it possible by a displacement in the switching on and off of the transistors of one diagonal of the bridge to improve the efficiency of the system and make it insensitive to parameter drifts of components used under gamma radiation.

The invention proposes a control system for direct current actuators in power electronics, based on pulse width modulation, comprising a H-bridge of four switches, each switch incorporating a transistor T1,T2,T3 or T4 and a diode D1,D2, D3 or D4 connected in reverse parallel on said transistor, and a control circuit for said transistors, characterized in that each transistor is of the bipolar type and that the control circuit supplies four signals V1,V2,V3 and V4 permitting a time shift of the switching of these four transistors T1,T2,T3 and T4, so that during a switching of one of them no pair of transistors is simultaneously switched on, both with regards to the transistors belonging to two lateral branches of the bridge (i.e. in two branches positioned between the two d.c. supply terminals of the bridge) and with regards to the transistors belonging to two opposite branches of said bridge. Preferably, for controlling the two transistors T2 and T3 forming the base of the bridge, said control circuit supplies two first signals V2 and V3 respectively supplied to the base of each of these two transistors by means of a push-pull circuit in order to adapt the level and the power and, for controlling the two transistors T1 and T4 forming the top of the bridge, it supplies two second signals respectively supplied to the base of each of these two transistors by means of a galvanic isolation, produced by a control transformer.

Whilst retaining the known pulse width modulation principle, the system according to the invention uses bipolar transistors, which modifies the characteristics of said system compared with H-switches operating with MOS transistors.

Advantageously, for controlling the transistors of the top of the bridge, the system according to the invention comprises a switching power supply operating from an oscillator driving a mains transformer. At the secondary of said transformer, the signal is rectified and filtered in order to supply voltages +Va and −Va. Each of the second signals is overmodulated in order to drive a control transformer, said overmodulation being carried out by the same oscillator and a modulation logic. For driving the corresponding bridge bipolar transistor, the signal is demodulated with the aid of a rectifier and amplified whilst adapting its level.

In an advantageous embodiment, the system according to the invention comprises four drivers and a Hall effect current measuring means making it possible to close the current servo-loop, a resistor making it possible to measure the current for possibly rendering secure.

The clock of the logic modulation module is formed by a Schmitt trigger oscillator and a D flip-flop connected as a binary scaler, having a cyclic ratio of 50% in order to avoid d.c. components in the transformer. The modulation is carried out by logic AND gates.

The primary of the switching power supply is brought about with the same clock from the flip-flop followed by a push-pull-type transistor stage. The transformer is solely for the two switching power supplies of each of the top drivers, the secondaries being duplicated and independent.

The system according to the invention comprises two top drivers in which the secondary of the switching power supply is constituted on the one hand by a rectification implemented by four Schottky diodes in order to limit the voltage drop and on the other by a filtering performed by two capacitors in order in this way to obtain two symmetrical voltages supplying the power stage. This power stage is constituted by the pulse transformer making it possible to recover the modulated signal from the logic modulation module, the demodulation being performed by the two Schottky diodes connected in rectifier form with the centre point, the thus rectified signal driving a push-pull-type transistor amplifier, the floating earth of the supply being connected to the power transistor emitter.

The system according to the invention offers numerous advantages:

- It offers an optimum efficiency, short-circuits being impossible during switching operations and the transistors being saturated to the maximum, the efficiency performance characteristics being comparable to those obtained with MOS transistors.
- It offers an optimum resistance to gamma rays (exceeding $10^6$ rads) due to the use of radiation-resistant components.
- It has a simple operating principle and a reduced number of components required for operation.
- It does not require the use of very high performance power transistors, particularly with regards to the passband.
- It can be adapted as regards current and voltage by simply changing the transistor, but without changing the principle.
- It can operate continuously on one branch of the H, which is not always the case for other operating principles.
- It is ideal for the control of d.c. motors having a low impedance due to the high cutoff frequency thereof (35 KHz).
- It has a principle transposable to other motor types, particularly auto-controlled synchronous motors.
- It has a low production cost due to the use of standard commercial components.

DETAILED DESCRIPTION OF EMBODIMENTS

In power electronics, in any transformation the fundamental idea is that of efficiency. The basic component can no longer operate in modulation because the losses, product of the current by the voltage drop, would be too prejudicial to the efficiency. It is then necessary to operate in switching, the basic component being the power semiconductor operating as a switch. When the "switch" is open, the current flowing through it must be negligible, even if it is subject to a high voltage, so that a minimum power is consumed. In the same way when the "switch" is closed, although a high current is flowing through, its voltage drop must internally be very low so that losses are negligible compared with the nominal power.

Statically the power semiconductor plays a part identical to that of a mechanical switch, so that when closed or on it permits the passage of current and causes the minimum possible voltage drop, whereas when open or off, it does not permit the passage of current despite the voltage at its terminals.

The control signals supplied to an electronic power circuit only serve to fix the times at which the "switches" are turned on. The power corresponding to these off signals is very low compared with that flowing through the circuit.

Figure 1:
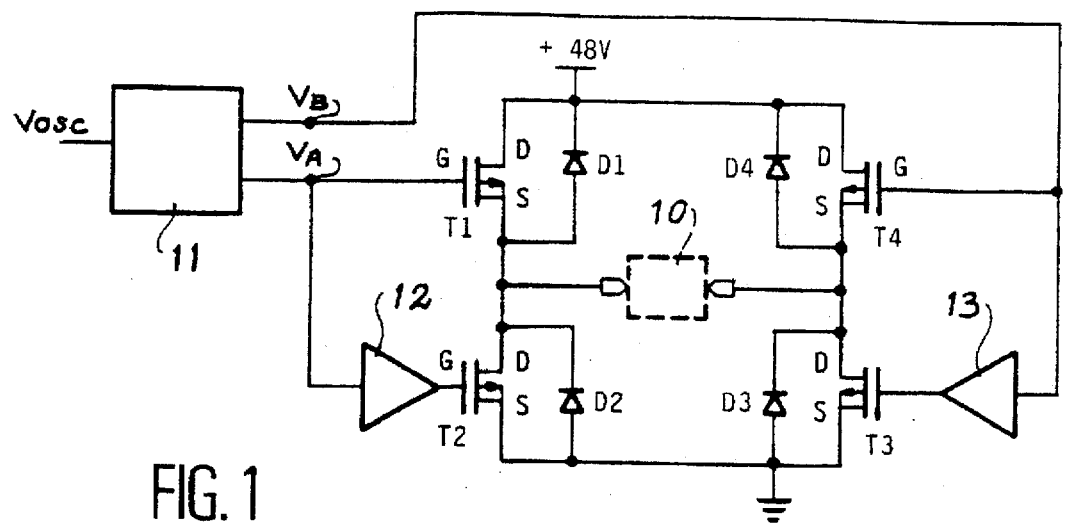
FIG. 1 illustrates a prior art control system.

FIG. 1 illustrates a known control system, in which the switches are MOS transistors T1,T2,T3 and T4 connected in the form of a H-bridge, the load 10 being in the centre of the H. An oscillation period is fixed, whose frequency can be from a few kHz to a few dozen kHz. The pulse width modulation principle consists, during this period, of successively closing the transistors T1 and T3 and then T2 and T4 for a time variable in accordance with a desired procedure Vosc. Two inverters 12 and 13 make it possible to invert the signals VA and VB in order to control the bases of the transistors T2 and T3. A control circuit 11 generates transistor control signals. These circuits are commercially available (e.g. L292 from Thomson, SG1731 from Silicon General and UDN1637 from Unitrode). Diodes D1,D2,D3 and D4 are connected in reverse parallel of the transistors and are referred to as freewheeling diodes. Their function is to permit the passage of reverse currents in the switches, because motors are inductive elements supplying current. It is therefore necessary for each amplifier to be reversible.

Figure 2:
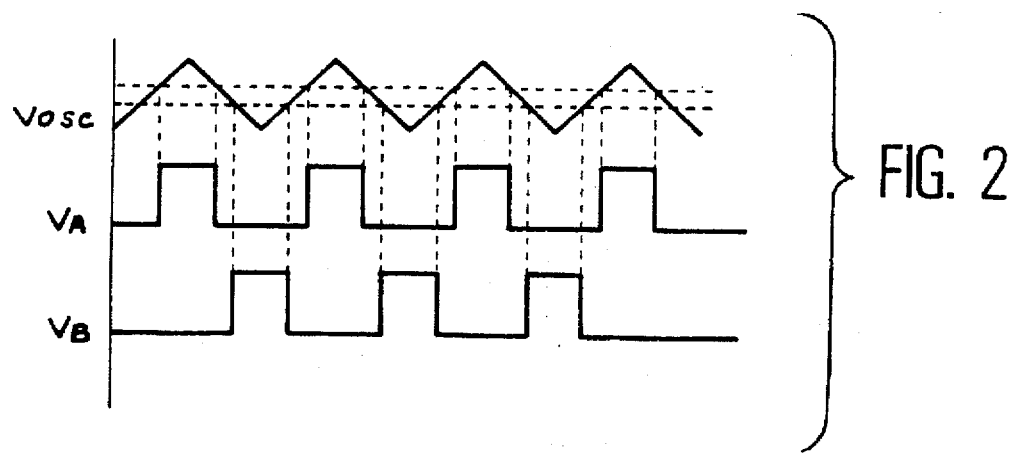
FIG. 2 shows the control signals of the system of FIG. 1.

In the control circuit, as shown in FIG. 2, initially there is a sawtooth signal Vosc and two signals VA and VB, corresponding to the control signals of the transistors are produced, so that there is an "idle time" between the two switching operations of the branches of the H. A procedure variation is obtained by adding to the sawtooth Vosc a d.c. component which makes the width of the pulses VA and VB vary and therefore modifies the current in the load.

Specifically the signal VA controls the transistor T1 directly and the transistor T2 across the inverter 12 and the signal VB controls the transistor T4 directly and the transistor T3 across the inverter 13. This system makes it possible to have a certain security between the switching of the two branches of the bridge (due to the idle time), but there is a risk of supply short-circuits between the transistors T1 and T2 on the one hand and the transistors T3 and T4 on the other. Thus, they are simultaneously controlled on opening and closing. Thus, designers desire to speed up the switching times and use fast power components.

For the design of amplifiers, the use of MOS transistors offers numerous advantages and in particular they are considered as being simpler to control. However, such MOS transistors cause serious problems with respect to their resistance to radiation (destruction for an accumulated dose below 100 Krads).

The case of IGBT transistors, which are an assembly of a MOS transistor at the input and a bipolar transistor at the output, does not solve the problem with respect to radiation resistance. Thus, such IGBT transistors are reserved for high powers under high voltages.

On using bipolar transistors, the latter operate in the two modes described hereinbefore. Power switches designed on the basis of bipolar transistors make it possible to switch high powers. A transistor in the on state operates under saturation conditions, i.e. there is a minimum voltage drop at the terminals. In order to obtain this condition a necessary basic current is supplied (data from the manufacturer). In the other case it is off and the basic current is zero.

From a dynamic standpoint, it is necessary to pass from the off state to the saturated state of the transistors as rapidly as possible in order to prevent short-circuits. Designers of transistors give the on and off delays, which are not acceptable, so that it is necessary to use switching assisting systems.

There are numerous diagrams and circuits for assisting switching and a few examples are given below:

In order to reduce the starting time, the basic current must increase as quickly as possible and for this purpose a current peak is supplied exceeding the value necessary for saturation.

During conduction, it is necessary for the basic current to be adequate to ensure saturation, but it must avoid supersaturation, which would greatly increase the storage time at the end of the conducting phase, so that for this purpose a so-called "antisaturation" diode is used between the base and the collector.

In order to reduce the off time, it is necessary to extract from the base a reverse current whilst limiting the basic current decrease speed and for this purpose the transistor is switched off with a negative voltage and the charges stored in the base are dissipated as rapidly as possible.

Each transistor model requires a particular, relatively complicated and voluminous circuitry and for this reason use is often made of specific, commercially available, integrated circuits.

It is pointed out that the driving of said transistors must usually be floating, which involves the use of isolating components such as optocouplers or transformers.

The invention proposes the use of bipolar transistors which have a particularly good resistance to gamma rays, whilst avoiding the use, for the control thereof, of complex, commercial components, whose behaviour under radiation is not known and using a minimum of discrete components.

The invention proposes no principle other than pulse width modulation for controlling the motor or for attempting to more rapidly switch the power transistors, but consists of considering that it is not possible to more rapidly switch said switches, so that it is assumed that they do not have to be fast. Thus, the invention proposes a novel system with respect to the control, whilst retaining the pulse width modulation principle.

The main problem of the prior art system is that the transistors are switched in pairs. One of them passes from the off state to the saturated state and the other from the saturated state to the off state in an instantaneous manner.

Figure 3:
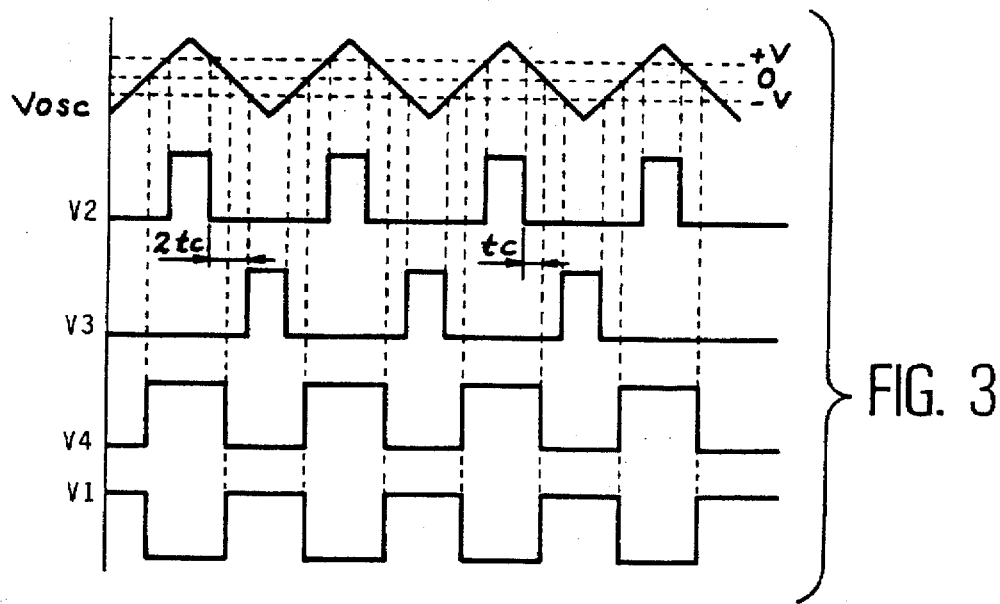
FIG. 3 shows the control signals of the system according to the invention.
Figure 4:
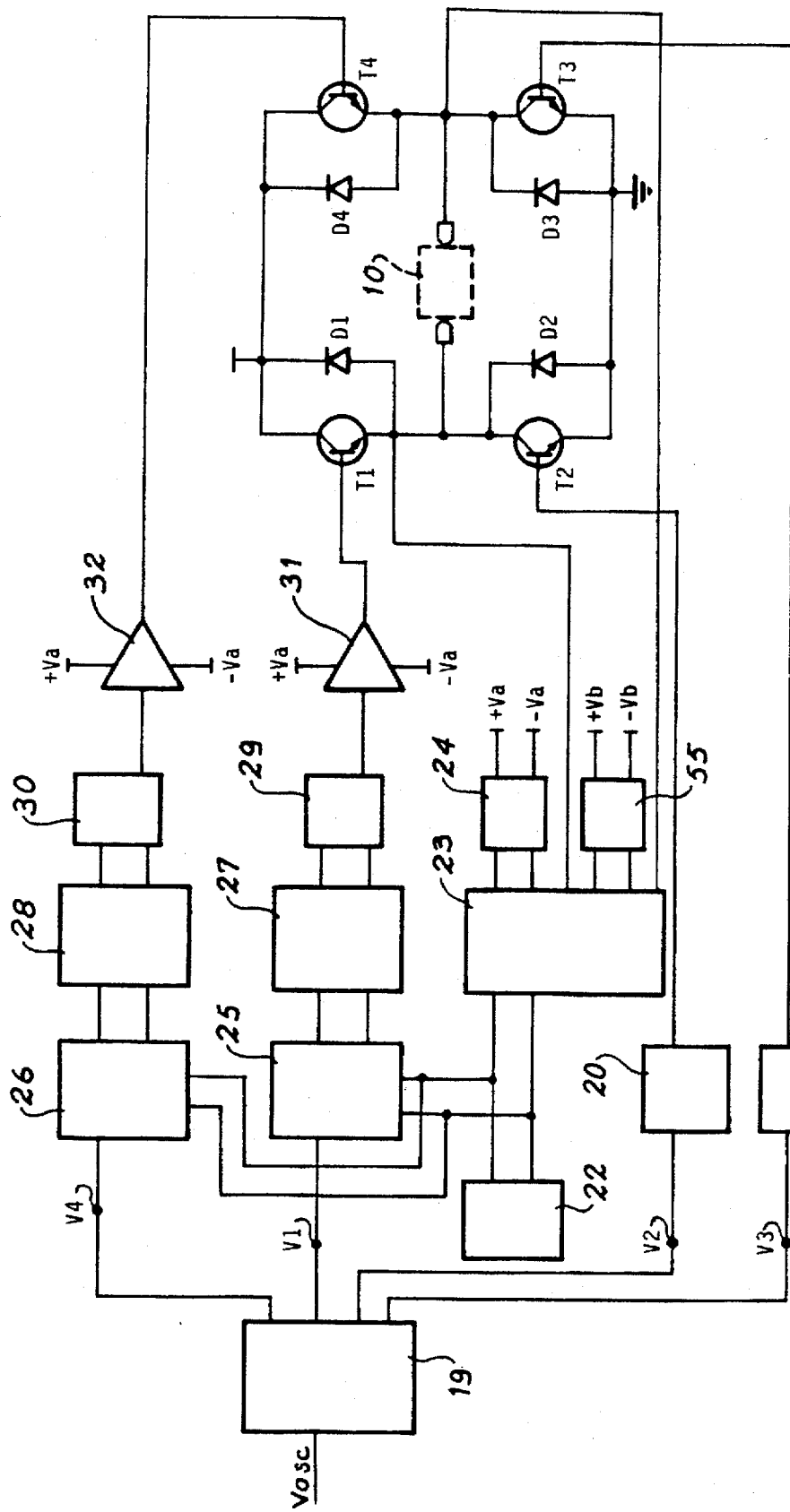
FIG. 4 illustrates the system according to the invention.

The idea of the invention is the time shifting of the switching of the four transistors in such a way that no short-circuit is possible during a switching operation. It is permissible to shift said switching operations to the extent which is necessary, i.e. by a time exceeding the maximum switching time of the transistors and the procedure is as illustrated in FIG. 3.

Thus, use is made of a known control circuit. Once again there is a sawtooth generator Vosc and two control signals V2 and V3 equivalent to VA and VB hereinbefore. The latter will only drive the transistors of the base T2 and T3. The thresholds +V and −V making it possible to produce "idle times" are simply adjusted in such a way that the latter are equal to twice the maximum switching time of a transistor (tc). A third voltage zero threshold is produced by an external circuit (comparator), which makes it possible to produce the signals V1 and V4, which will drive the transistors T1 and T4. Thus, the four transistors are switched at different times separated by the time tc.

A switching sequence takes place in the following way:
transistor T1 is switched on, but as the others are not on, it is not possible to supply current to the load,
transistor T3 is switched on and current can be supplied to the load,
transistor T3 is placed under high impedance and current cannot be supplied to the load,
transistor T1 is placed under high impedance and T4 is switched on and current cannot be supplied to the load,
transistor T2 is switched on and current can be supplied to the load,
transistor T2 is placed under high impedance and current cannot be supplied to the load.

The presence or absence of current in the transistors is also a function of the state of system at the time of switching on. This is why reference is made to the conduction or off state and the possibility of supplying current. This control involves an asymmetry in the circuit, which was not the case in the prior art system of FIG. 1.

The power switch is constituted by a bipolar transistor with its freewheeling diode. Among the switching improvement devices, use is only made of the reverse polarization of the base.

For controlling the transistors of the base T2 and T3, use is made of signals V2 and V3 obtained at the output of the control circuit 19 directly, simply by intercalating a push-pull-type circuit 20, 21 in order to adapt the levels and power.

In order to control the transistors of the top T1 and T4, a galvanic isolation is intercalated between the signals V1 and V4 and the transistor in question. This isolation is provided by a control transformer. The presence of a galvanic isolation involves the use of a floating supply at the driving amplifier. The latter is a switching power supply operating on the basis of a 150 KHz oscillator 22 driving a transformer 23. At the secondary of the latter the signal is rectified and filtered (circuits 24 and 55) in order to supply voltages +Va and −Va on the one hand and voltages +Vb and −Vb on the other. The signal V1 (or V4) is overmodulated in a modulation logic 25 (or 26) for driving the control transformer 27 (or 28), because it is necessary to avoid d.c. components in the latter. This overmodulation is obtained by the same oscillator 22 and the modulation logic. For driving the transistor it is then sufficient to demodulate the signal with the aid of a rectifier 29 (or 30) and the amplifier (amplifier 31 (or 32)), whilst adapting the level thereof.

In prior art devices, the use of power electronics under gamma radiation gave rise to the problem of the behaviour of the power components in the ionizing medium. In the case of the control of a direct current motor, it is standard practice to use a H-bridge of four transistors in the centre of which is connected the load (cf. FIG. 1). In the industrial environment use is often made of MOS or IGBT transistors, but in this case interest is only attached to bipolar transistors for reasons of resistance to the accumulated dose of gamma rays.

The control of the H-bridge takes place in accordance with the following principle (cf. FIG. 2). The transistors T1 and T3 are closed simultaneously, followed by the transistors T2 and T4. The conducting time of one diagonal of the bridge compared with the other is varied whilst maintaining the constant period (pulse width modulation principle). A time tc during which no transistor is switched on is provided so as to avoid any supply short-circuit by means of T1 and T2 on the one hand and T3 and T4 on the other.

Figure 5:
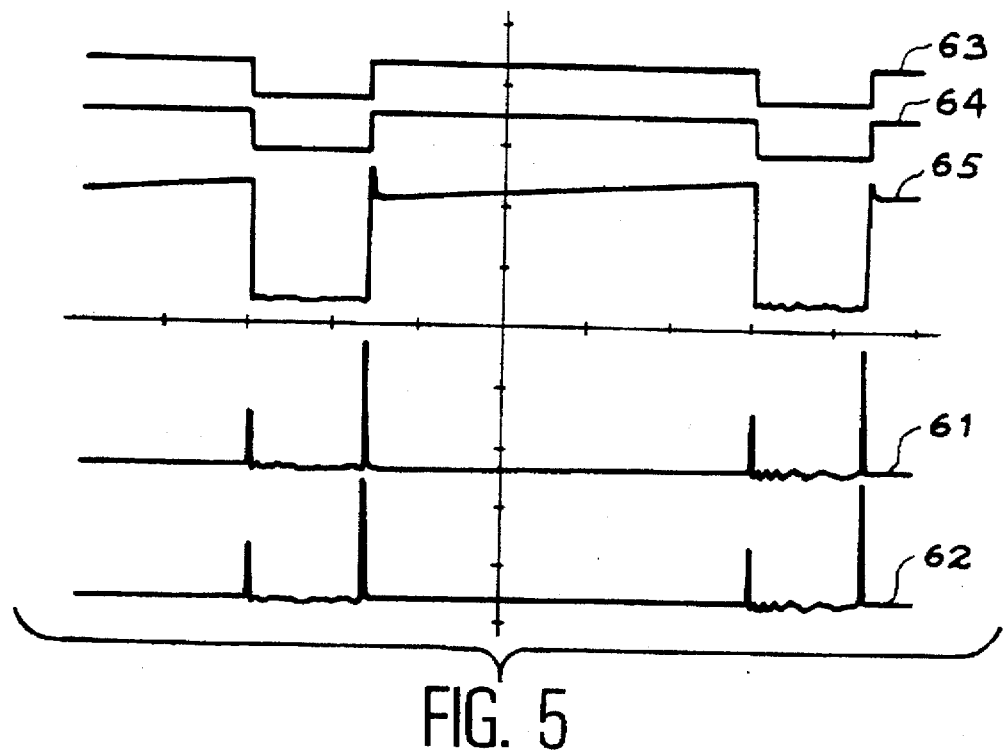
FIGS. 5 and 6 respectively illustrate different curves representing the operation of a prior art device and that of the control system of the invention.

The power dissipated by the two transistors T1 and T3 (SPICE simulation) is shown in FIG. 5, where we respectively have:

a signal 61: power in T1, a signal 62: power in T3, a signal 63: VA controls T1, a signal 64: VB controls T3, a signal 65: collector current.

It can be observed that the power to be dissipated is uniformly distributed over the two transistors. It is subdivided into a continuous static power, whose cause is the saturation voltage of the transistor, and a dynamic power, whose cause is the switching times.

The improvement to the efficiency of such a circuit passes via the optimization of the losses in the transistors. From a static standpoint, it is necessary to bring about a maximum saturation of the transistors and from a dynamic standpoint it is necessary to bring about a maximum acceleration of the switching operations. The supersaturation of a transistor extends the switching times, so that it is a compromise.

As has been described hereinbefore, use is generally made of circuits of varying complexity in order to accelerate the switching operations. The latter are often advanced for their settings and operate at the limits of the possibilities of the components and have the effect of increasing the static power due to the saturation voltage of the transistors.

Such circuits are difficult to use under gamma radiation, because the parameters of the components used are liable to evolve significantly and have catastrophic consequences for the performances of an amplifier. In particular, the saturation voltages of the transistors (Vcesat) are liable to increase under gamma radiation.

In the solution proposed by the invention, it has been decided to simplify the driving stages of the switches and give preference to the static aspect by completely saturating the transistors. As a result the switching times of the system according to the invention are extended.

In order to minimize dynamic losses, there has been a modification to the sequencing of the switching on of the transistors in the manner indicated hereinafter (cf. FIG. 3).

Whilst retaining the time tc during which no transistor is on, but unlike in the prior art systems, in the system according to the invention the transistors T1 and T3 receiving the signals V1 and V3 on the one hand and the transistors T2 and T4 receiving the signals V2 and V4 on the other are not simultaneously switched on. Firstly T1 or T4 are switched on and following a time tc exceeding the recovery time of the transistors used, the transistors T2 or T3 are in turn switched on and current starts to flow. After a time varying as a function of the desired control, the transistors T2 or T3 are switched off and the current stopped. After a time tc the transistors T1 or T4 are switched off.

Figure 6:
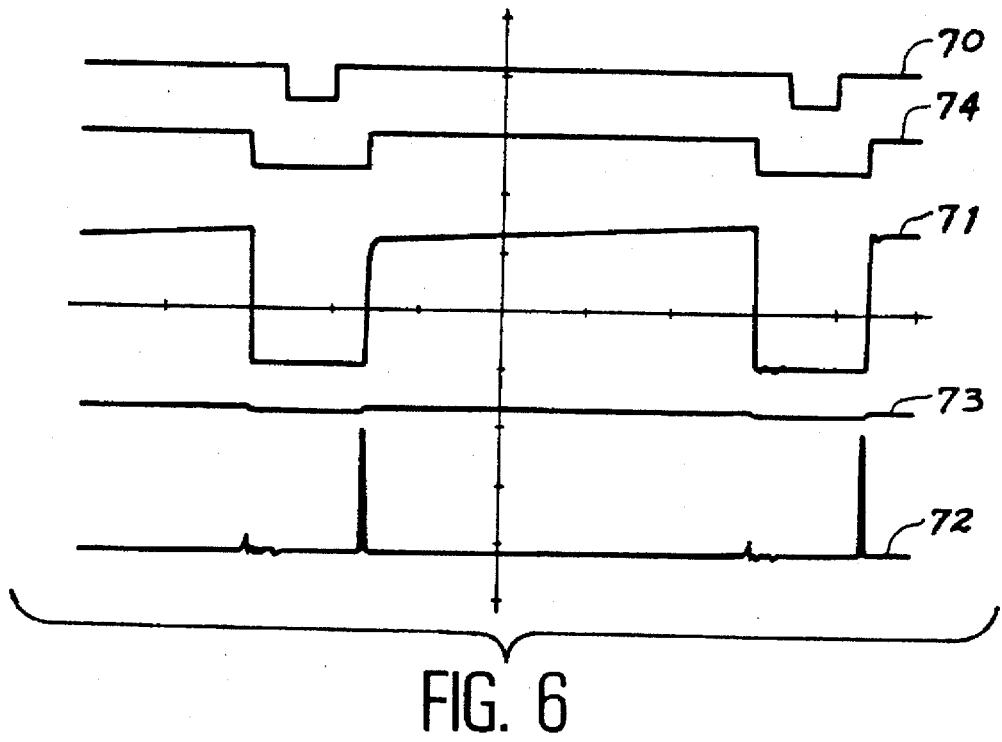

The power dissipated by the two transistors T1 and T3 (SPICE simulation) is then shown in FIG. 6, where we respectively obtain:

a signal 70: V3 controls T3, a signal 71: collector current, a signal 72: power in T3, a signal 73: power in T1, a signal 74: V1 controls T1.

It can be seen that the transistor T1 has no dynamic power to dissipate, but only a static power. Only transistor T3 has a dynamic and static power. The overall balance of dissipated powers makes it possible to improve the efficiency of the amplifier.

In an embodiment, an amplifier for controlling a d.c. motor of a robot operating in a hostile environment is able to supply a current of 10 A under a voltage of 60 V. It is current-controlled and can control the speed of the motor. It has an efficiency making it usable in an industrial application.

Figure 7:
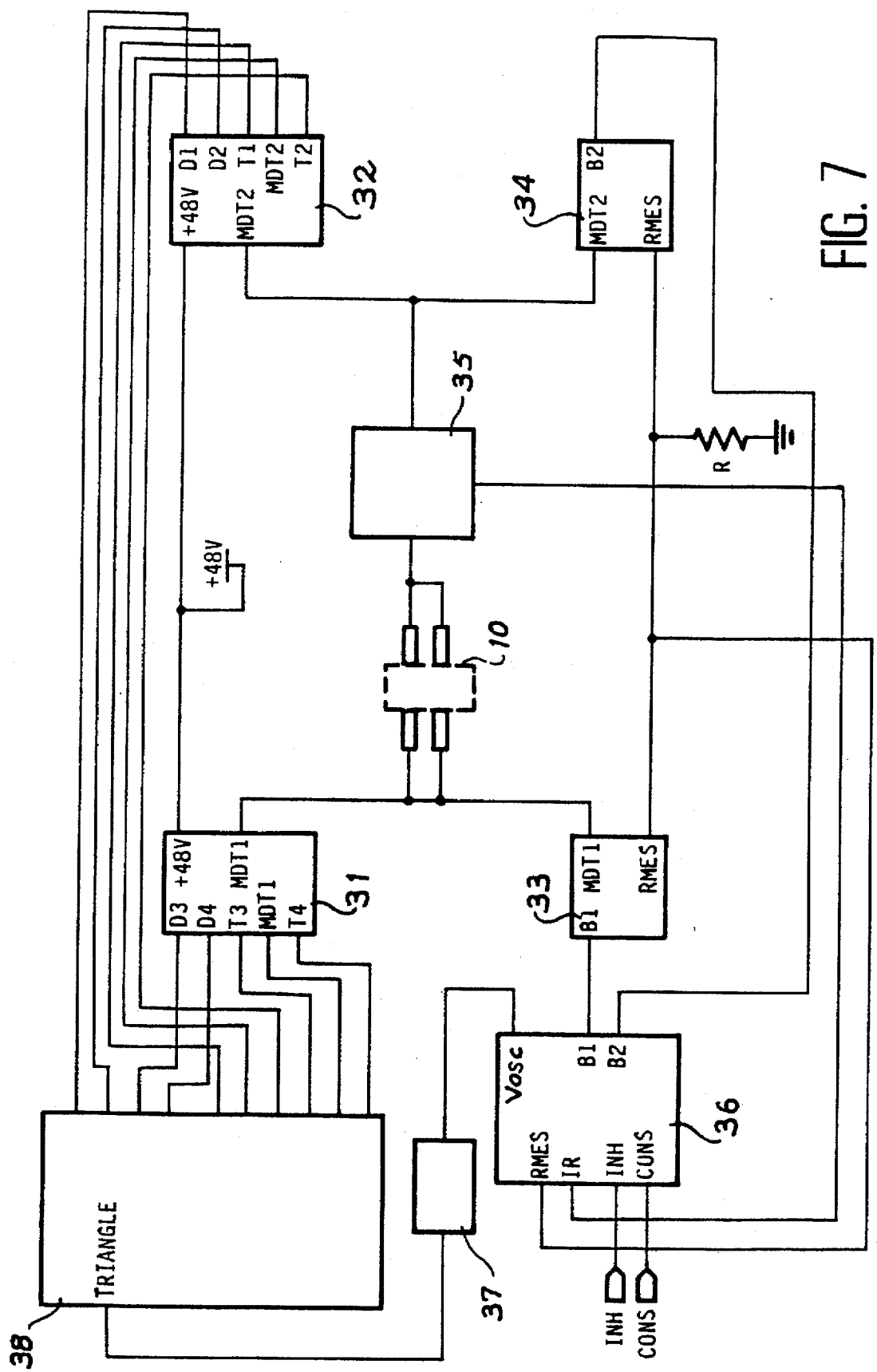
FIGS. 7 to 10 illustrate an embodiment of the system according to the invention.

The speed control part of the amplifier not forming part of the present invention is not described here. The mimic diagram of FIG. 7 shows the different modules forming said amplifier.

The H-bridge is symbolized by the four drivers 31,32,33 and 34, which are in fact power switches. The load 10 is on the horizontal bar of the H. A Hall effect current measuring means 35 makes it possible to close the current servoloop A resistor R makes it possible to measure the current for a possible placing under secure conditions.

There is a control circuit 36, which receives the current procedures from the servocontrol module (not shown). The latter supplies on the one hand signals B1 and B2 equivalent to the above-defined signals V2 and V3 and on the other, after passing into a comparator 37, the "triangle" signal equivalent to the signal Vosc. The signals B1 and B2 make it possible to drive the two bottom drivers.

There is also the "logic modulation" module 38 producing the driving signals for the top drivers.

The control circuit 36 is the "intelligent" part of the amplifier and is e.g. constituted by circuit UDN3637 of Unitrode. By means of a certain number of discrete components said circuit produces the signals B1 and B2 for driving the bottom drivers and receives the signals:

CONS: servocontrol current procedure signal,

IR: return of measured current signal for the current control,

RMES: return of measured current signal for current limitation,

INH: amplifier inhibition input.

This circuit 36 makes available to the user the signal Vosc. It is used here for producing the "triangle" signal, which is produced by means of the comparator 37.

Figure 8:
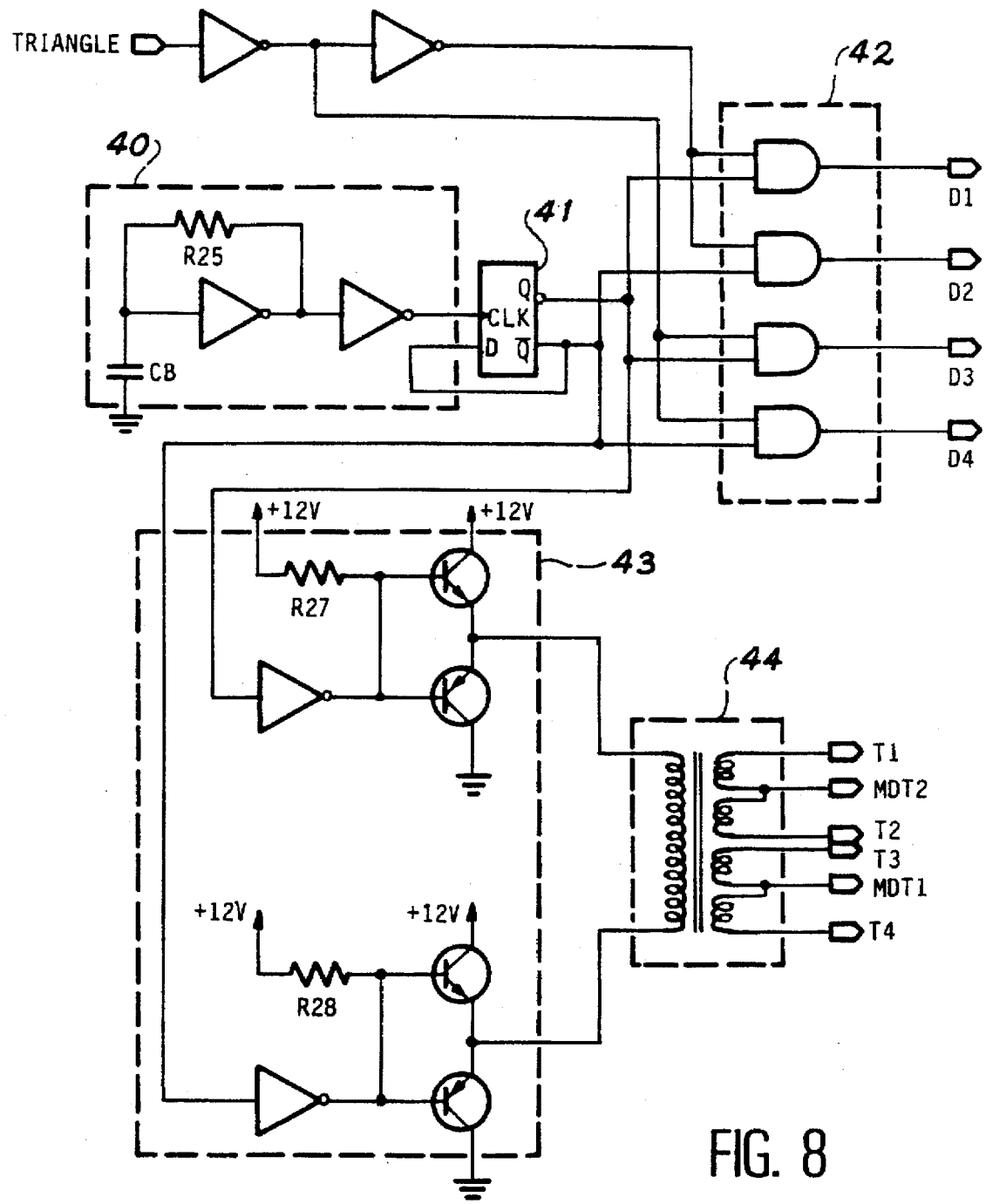

The logic modulation module 38 shown in FIG. 8 receives the "triangle" signal, which is the signal to be modulated. The modulation clock is produced by a Schmitt trigger oscillator 40 (FIG. 8) and a D flip-flop 41 connected as a binary scaler.

The latter must have a cyclic ratio of 50% to avoid d.c. components in the transformer. Modulation is carried out by logic AND gates 42 receiving on the one hand the "triangle" signal and its inverse to be modulated and on the other the clock. Two outputs drive the transformer of the top driver 31 and two outputs drive the transformer of the top driver 32.

The primary of the switching power supply is implemented with the same clock from the flip-flop 41 followed by a push-pull-type transistor stage 43. The transformer 44 is solely for the two switching power supplies of each of the top drivers, the secondaries being duplicated and independent.

In an exemplified embodiment, it is possible to have components with the following values:

R25=R27=R28=470Ω

R26=4.7 KΩ

C8=4.7 nF.

Figure 9:
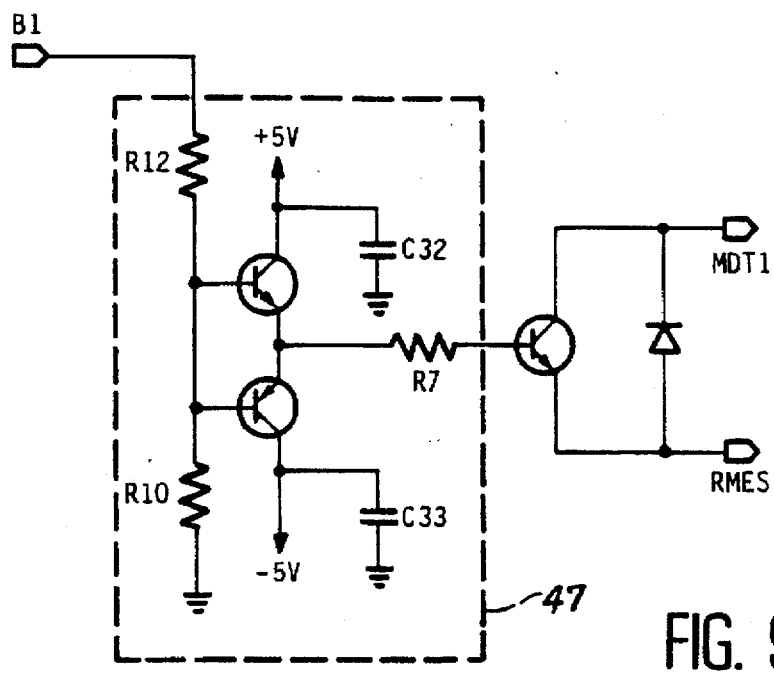

The bottom driver shown in FIG. 9 is simply constituted by a push-pull-type transistor amplification stage 47 and the actual power switch. The latter can use Motorola power transistors of the BUS 36 type, as well as a freewheeling diode MUR 460 from the same manufacturer.

Driving takes place through the point B1 and is necessarily referenced with respect to earth.

In an exemplified embodiment, it is possible to have components with the following values:

R12=380Ω

R10=220Ω

R7=12Ω

C32=C33=0.1 μF.

Figure 10:
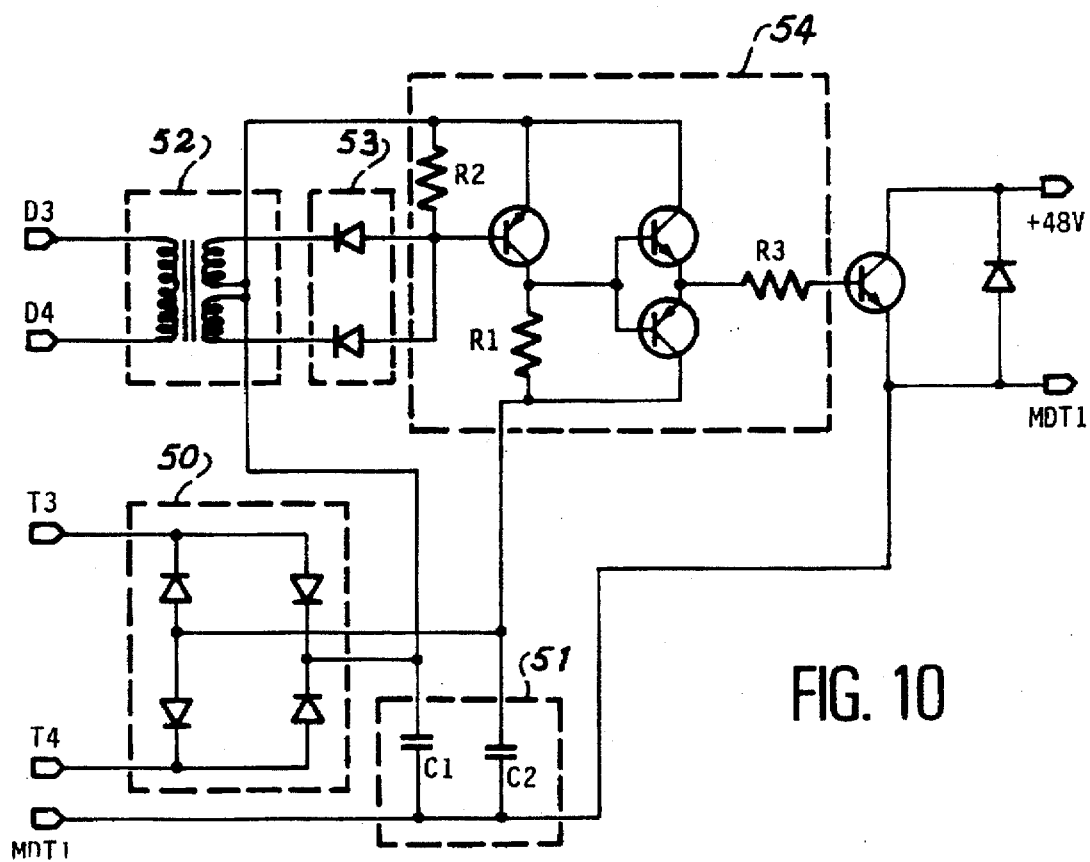

The top driver shown in FIG. 10 is constituted by two essential parts.

The secondary of the switching power supply constituted by on the one hand a rectifier 50 embodied by four Schottky diodes, e.g. of type IN 5818 for limiting the voltage drop and on the other a filtering means 51 embodied by two capacitors. Thus, there are two symmetrical voltages of +4 V and −4 V, which supply the power stage.

The power stage is constituted by the pulse transformer 52 making it possible to recover the modulated signal from the "logic modulation" module. Demodulation takes place by two Schottky diodes 53 connected in rectifier form with the centre point. The thus rectified signal drives a push-pull-type transistor amplifier 54. The floating earth of the supply is connected to the emitter of the power transistor.

The freewheeling diode is not identical to that of the bottom drivers and can be a diode of Motorola type MBR 10100. Thus, it must not be forgotten that the circuit is not symmetrical. On the top drivers the transistor conduction phase is shorter, which increases the conduction time of the diodes, hence the use of more powerful components.

In an exemplified embodiment, it is possible to have components with the following values:

R2=47Ω

R1=560Ω

R3=3.9Ω

C1=C2=15 μF.

The potential applications of such a system relate to two fields:
The electronics field:

For the civil nuclear sphere: this principle is ideal for supplying the actuators of inspection or intervention machines when the latter are mobile and require compact and high performance equipment. The high efficiency of said amplifier makes it possible to increase the autonomy of these systems and its limited volume permits its easier housing in an on-board system. In the same nuclear sphere, this principle can be used for supplying actuators of telemanipulating arms. The amplifier can be placed at the base of the arm in the "hot" area. It operates without any significant parameter drift beyond an integrated dose of $10^6$ rads. It thus avoids the passage of a cable having a large cross-section, which causes significant problems between the cell and the exterior. Outside the civil nuclear sphere: this principle can be used in other fields involving the presence of ionizing rays, such as the space, military and medical fields.

The industrial field:

this principle is compatible with the requirements of an industrial product with respect to its performance characteristics and costs, which are no higher than those of any other industrial amplifier. The principle is also adaptable on the one hand to other currents and voltages by changing the power switches and on the other to other types of motors such as auto-controlled synchronous motors.

We claim:

1. System for the control of direct current actuators in power electronics, based on pulse width modulation, comprising a H-bridge of four switches, each switch incorporating a transistor and a diode connected in reverse parallel between the emitter and the collector thereof, and a control circuit for said transistors, wherein each transistor is of the bipolar type and wherein the control circuit supplies four signals permitting the time shifting of the switching of these four transistors in such a way that during a switching of one of said four transistors, no other one of said four transistors is switched on simultaneously, both with respect to the transistors belonging to the two lateral branches of the bridge and the transistors belonging to the two opposite branches of said bridge.

2. System according to claim 1 which, for controlling the two transistors forming the base of the bridge, supplies two first signals respectively supplied to the base of each of these two transistors via a push-pull-type circuit for adapting the level and power.

3. System according to claim 1, which, for controlling the two transistors forming the top of the bridge, supplies two second signals respectively supplied to the base of each of these two transistors via a galvanic isolation, embodied by a control transformer.

4. A system for the control of direct current actuators in power electronics, based on pulse width modulation, comprising:

a H-bridge of four switches, each switch incorporating a transistor and a diode connected in reverse parallel between the emitter and the collector thereof;

a control circuit for said transistors, wherein each transistor is of the bipolar type and wherein the control circuit supplies four signals permitting the time shifting of the switching of these four transistors in such a way that, during a switching of one of them, no pair of transistors is switched on simultaneously, either with respect to the transistors belonging to the lateral branches of the bridge or the transistors belonging to the two opposite sides of the bridge; and for controlling the transistors of the top of the bridge, two switching power supplies based on an oscillator driving a mains transformer, wherein, at the secondary of said transformer, the signal is rectified and filtered to supply the voltages +Va and −Va and +Vb and −Vb, wherein each of the second signals is overmodulated to drive a control transformer, said overmodulation being obtained through the same oscillator and a modulation logic and wherein for driving the corresponding bridge bipolar transistor, the signal is demodulated with the aid of a rectifier and amplified adapting the level thereof.

5. System according to claim 1, comprising four drivers and a Hall effect current measuring means making it possible to close the current servoloop and a resistor making it possible to measure the current for a possible rendering secure.

6. System according to claim 5, wherein the clock of the logic modulation module is produced by a Schmitt trigger oscillator and a D flip-flop connected as a binary scaler, having a cyclic ratio of 50% for avoiding d.c. components in the transformer and wherein the modulation is performed by logic AND gates.

7. A system according to claim 6, wherein the primary of the logic modulation module is provided with the same clock from the flip-flop, followed by a push-pull-type transistor stage and wherein the transformer is solely for the two switching power supplies of each of the top drivers, the secondaries being duplicated and independent.

8. A system for the control of direct current actuators in power electronics, based on pulse width modulation, comprising:

a H-bridge of four switches, each switch incorporating a transistor and a diode connected in reverse parallel between the emitter and the collector thereof, a control circuit for said transistors, wherein each transistor is of the bipolar type and wherein the control circuit supplies four signals permitting the time shifting of the switching of these four transistors in such a way that, during switching of one of them, no pair of transistors is switched on simultaneously, either with respect to the transistors belonging to the lateral branches of the bridge or the transistors belonging to the two opposite sides of the bridge;

four drivers and a Hall effect current measuring means for closing the current servoloop, a resistor for measuring the current; and two top drivers, in which the secondary of the switching power supply is constituted on the one hand by a rectification implemented by four Schottky diodes for limiting the voltage drop and on the other by a filtering implemented by two capacitors for obtaining two symmetrical voltages supplying the power stage and wherein said power stage is constituted by the pulse transformer making it possible to recover the modulated signal from the logic modulation module, demodulation being performed by the two Schottky diodes connected in rectifier form with the centre point, the thus rectified signal driving a push-pull-type transistor amplifier, the floating earth of the supply being connected to the emitter of the power amplifier.

* * * * *